United States Patent [19]

Emmons et al.

[11] Patent Number: 4,592,816
[45] Date of Patent: Jun. 3, 1986

[54] ELECTROPHORETIC DEPOSITION PROCESS

[75] Inventors: William D. Emmons, Huntingdon Valley; Mark R. Winkle, Lansdale, both of Pa.

[73] Assignee: Rohm and Haas Company, Philadelphia, Pa.

[21] Appl. No.: 654,821

[22] Filed: Sep. 26, 1984

[51] Int. Cl.⁴ .................... C25D 13/06; C25D 13/12; C25D 13/20
[52] U.S. Cl. .................................. 204/180.6; 204/15; 204/180.2; 204/181.1; 204/181.7
[58] Field of Search ........... 204/181 E, 181 R, 181 C, 204/15, 180.2, 180.6, 181.7, 181.1

[56] References Cited

U.S. PATENT DOCUMENTS

| | | | |
|---|---|---|---|
| 3,954,587 | 5/1976 | Kokawa | 204/181 E |
| 4,025,409 | 5/1977 | McGinniss | 204/181 E |
| 4,029,561 | 6/1977 | McGinniss | 204/181 E |
| 4,035,272 | 7/1977 | McGinniss | 204/181 E |
| 4,035,273 | 7/1977 | McGinniss | 204/181 E |
| 4,066,523 | 1/1978 | McGinniss | 204/181 E |
| 4,087,370 | 5/1978 | Singalewitch et al. | 252/143 |
| 4,263,394 | 4/1981 | Gates et al. | 430/287 |
| 4,357,221 | 11/1982 | Lehner et al. | 204/181 E |
| 4,400,252 | 8/1983 | Ushijima | 204/181 R |

OTHER PUBLICATIONS

Coombs, C. F., *Printed Circuit Handbook*, McGraw-Hill Book Co., New York, pp. 6-12-6-13 (1979).
DeForest, W. S., Photoresist Materials and Processes, McGraw-Hill Book Co., New York, pp. 11-14, 122-126 and 163-172 (1975).
Chemical Abstracts, vol. 88, 1978, p. 530, Abstract No. 97440w, Gates, A. P., et al, "Photopolymerizable Materials for Printing Plates".
Chemical Abstracts, vol. 86, 1977, p. 649, Abstract No. 99071j, Matsumoto, H., et al, Liquid Developers for Lithographic Photosensitive Plates Containing Diazo Compound".
"Chemical Abstracts, vol. 86, 1977, p. 649, Abstract No. 99070h, Tomita, K., et al, "Photoresist Composition".
Chemical Abstracts, vol. 86, 1977, p. 100, Abstract No. 173,213a, Singalewitch, J., et al, "Removing Photoresist Films".

Primary Examiner—John F. Niebling
Assistant Examiner—B. J. Boggs, Jr.

[57] ABSTRACT

The invention is directed to a photosensitive polymer composition capable of being electrophoretically depositable as an adherent, uniform photosensitive film on a conductive surface. The photosensitive polymer composition useful for electrodeposition is formed from an aqueous solution or emulsion of at least one polymer having charged carrier groups, a photoinitiator and a source of unsaturation for crosslinking the resulting film upon exposure to actinic radiation. The photosensitive film formed from the photosensitive polymer composition is aqueous developable and resistant to strong inorganic acids and strong bases. The photosensitive polymer composition is useful in the preparation of printed circuit boards, lithographic printing plates, cathode ray tubes, as well as in chemical milling, solder resist and planarizing layer applications.

4 Claims, 2 Drawing Figures

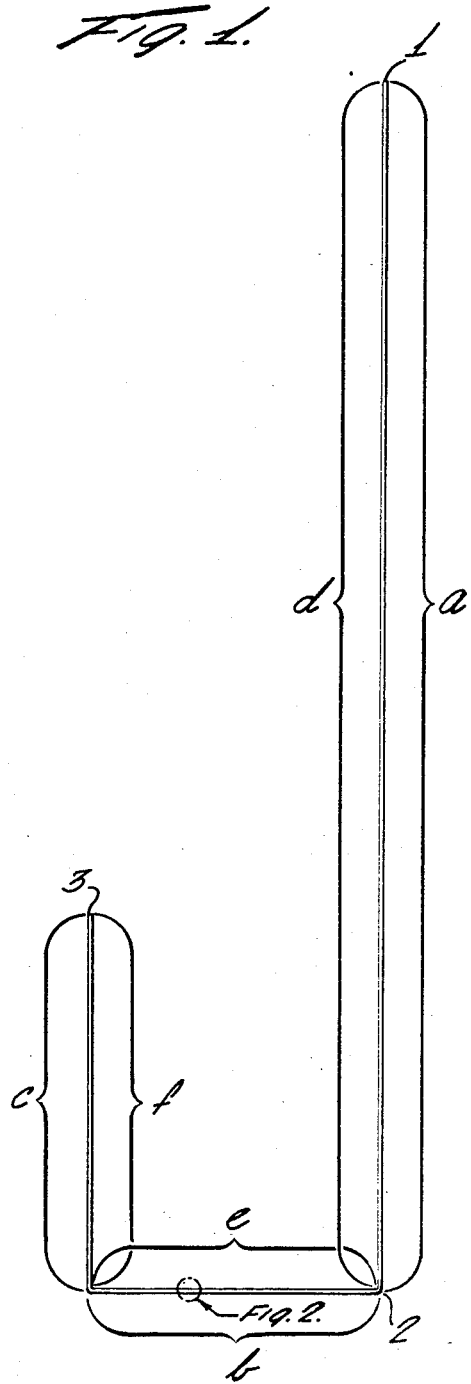
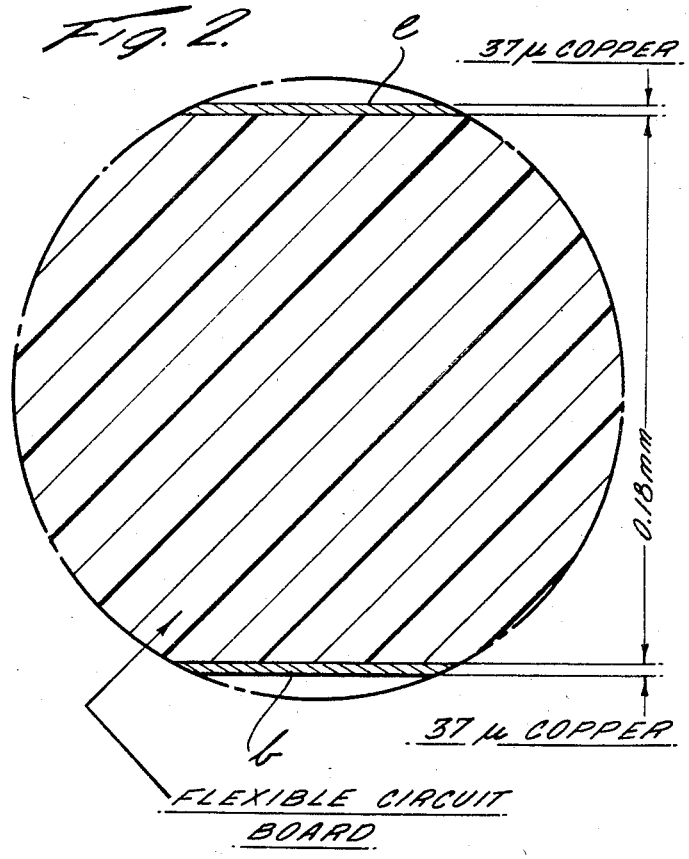

ELECTROPHORETIC DEPOSITION PROCESS

FIELD OF THE INVENTION

This invention relates to a photosensitive polymer composition and its use in an electrophoretic deposition process for applying an adherent, uniform photosensitive film on a conductive surface. More particularly, the invention relates to a photosensitive polymer composition, formed from an aqueous emulsion or solution of at least one polymer having charged carrier groups, a photoinitiator, and a source of unsaturation for crosslinking the deposited film upon exposure to actinic radiation, which is capable of being electrophoretically deposited on a conductive surface as a uniform, negative acting, aqueous developable film that is resistant to strong inorganic acids and aqueous bases. A preferred embodiment of the invention is directed to a cataphoretically depositable, aqueous developable, negative photoresist film formed from the photosensitive polymer composition containing at least one polymer having positively charged carrier groups, a photoinitiator and a unsaturated multifunctional crosslinking monomer.

BACKGROUND OF THE INVENTION

This invention is directed to the field of liquid-type photoresists and the process of electrophoresis for depositing such films on conductive surfaces.

Photoresists are photosensitive films capable of transferring an image onto a conductive surface such as, for example, the metal surface of a printed circuit board or lithographic plate. Liquid-type photoresists typically contain a combination of a film forming resin or polymer and a photosensitive compound or photoinitiator dissolved or suspended in a solvent such as an organic liquid.

Liquid-type photoresists can be negative-acting or positive-acting systems. In the case of a negative-acting photoresist or negative resist, after the film is deposited on a surface and the solvent is removed as by heating, the film is selectively exposed, typically through a photomask, to a source of energy, such as ultraviolet light. The photomask has areas that are opaque and other areas that are transparent to the exposing radiation. The pattern on the photomask formed by the opaque and transparent areas defines the desired image, such as, for example, a circuit, which is to be transferred to the substrate surface. The exposed portions of a negative resist film become less soluble in a developing solution, as the result of a photochemical reaction between the photoinitiator and the polymer or resin upon exposure, than the unexposed portions. This difference in solubility allows for the selective removal of the unexposed film and the transfer of the image to the surface. In a positive resist, the exposed portions of the film become more soluble in the developer than the unexposed portions, as a result of the photochemical reaction, allowing for the selective removal of the exposed areas. After either type of resist film is developed, the portions of the surface that are not protected by the resist may be etched, such as by the action of an oxidizing solution typically containing an inorganic acid. The remaining resist film may then be stripped from the surface leaving only the desired etched image on the substrate. Alternatively, the substrate surface containing the imaged resist can be plated with a metal or combination of metals, such as, for example, tin and lead. The resist may then be selectively stripped and the exposed metal on the substrate may be etched to form the desired pattern or a circuit on the substrate surface. The historical background, types and operation of conventional photoresists is described in *Photoresist Materials and Processes,* W. S. DeForest, McGraw-Hill, 1975.

Although liquid-type resists have been used for many years in lithographic and electronics applications, and despite numerous improvements to the resist systems and processing steps involved with their use, these conventional liquid resists still suffer from one or more disadvantages. For example, special surface preparations may be required to obtain good adhesion of a liquid resist film onto a surface. This increases the processing time and cost involved. The resists themselves may also require other special processing steps, such as hardening or baking steps, which also increase processing time. The cost of the resist components utilized in conventional systems combined with the loss of materials in depositing a film and the difficulty in reproducibly synthesizing stable systems, has also been a problem. The most widely recognized drawback of liquid resists, however, has been the difficulty to deposit films of uniform and adequate thickness on surfaces without the formation of voids or pinholes. Furthermore, there remains a need for a resist having resistance to etching and electroplating baths that are functional over a wide range of exposing radiations at minimal exposure doses and times. The use of organic solvents to formulate and develop liquid resists also presents a potential health, flammability and environmental concern, as well as adding to the potential for swelling the images formed and reducing the image resolution achievable.

Despite the abundance of conventional liquid type photosensitive coatings, dry film type resists are also important in the preparation of printed circuit boards. Dry film resists are multilayer films in which the photoresist is precast into a solid film and sandwiched between a polyethylene film and a polyester cover sheet. Dry film resists are described in U.S. Pat. Nos. 3,469,982, 4,378,264 and 4,343,885. The dry film resists are typically laminated onto the surface of a printed circuit board, as by application with hot rollers, after the bottom polyethylene film layer is peeled from the adjacent photoresist layer and top cover sheet. The transparent cover sheet, which provides mechanical support for the photoresist film layer, is usually kept in place until after the photoresist is exposed through a photomask and the cover sheet. After exposure, the cover sheet is peeled away from the resist film and the resist is developed and processed in a conventional manner.

Despite the advantages of these dry film resists over liquid type resists, such as the ability to apply a uniformly thick coating without pinholes, dry film resists also suffer from a number of drawbacks. Typically the conductive copper surface of a printed circuit board contains a protective coating, known as a chromate conversion coating, that protects the copper from oxidation. Before a dry film resist can be applied to the metal surface, the conversion coating must be removed as by abrasive scrubbing. This scrubbing roughens the surface and facilitates adhesion of the dry film resist to the substrate surface. However, the need for an abrasive scrubber can lead to defective circuitry on subsequent etching operations. Dry film resists may also have difficulty in adhering to metal surfaces unless the metal has been specially prepared. In addition, dry film resists cannot be used effectively with surfaces having irregular topographies. For instance, a small scratch in the substrate surface may not be filled by a dry film resist. The dry film will merely bridge the scratch and can allow etchant to seep into the scratch during etching resulting in unacceptable circuits. Furthermore, in addition to the high cost of dry film resists, their use also results in substantial waste of materials in the form of unusable strips of excess film because the dry film resists are typically trimmed to conform with the substrate surface to be coated.

A second aspect of the present invention relates to the process of electrophoretic deposition. Electrophoresis refers to the motion of charged particles or molecules through a liquid medium under the influence of an applied electrical field. Electrophoretic deposition or electrodeposition is conducted in an electrolytic cell where the surface of the conductive material, to be coated by the migrating charged particles, serves as one electrode. Polymers bearing a positive charge in the liquid medium, or polymers which become associated with a substance such as a surfactant having a positive charge, are known as cationic polymers. The electrodeposition of cationic polymers on the surface of a negatively charged electrode (cathode) is referred to as cataphoresis, while the electrophoretic deposition of negatively charged polymers (anionic polymers) onto the surface of a positively charged electrode (anode) is known as anaphoresis.

Coating metal objects with organic materials by electrophoresis is well known and is widely used to paint metal surfaces such as automobiles. Electrophoresis has been used to prepare electrical components, such as resistors and capacitors, that are integral to printed circuit boards (U.S. Pat. No. 3,303,078). U.S. Pat. No. 3,403,088 is directed to anaphoresis of water dispersed acrylic interpolymers to prepare thermally curable, non-photoactive, insulating coatings for electrical devices. U.S. Pat. No. 3,446,723 is also directed to thermally cured, non-photoactive, coatings preferably applied by cataphoresis. Cataphoresis is taught in this patent to be superior to anaphoresis because nascent oxygen does not react with the polymers. In addition, metal ions are eliminated from passing into solution resulting in a decrease in the water repellancy and discoloration of the coatings. Other patents disclosing the use of electrophoresis to deposit non-photoactive, thermally curable coatings include: U.S. Pat. Nos. 3,925,181; 3,975,251; 3,200,057; 4,238,385; and 4,338,235. *Polymer Compositions for Cationic Electrodepositable Coatings*, P. E. Kondomenos and J. D. Nordstrom, Journal of Coatings Technology, Volume 54, No. 686, March 1982, pages 33–41 also describes recent advances in this coating area.

Electrophoretic deposition of photosensitive coatings is also generally known. U.S. Pat. No. 3,738,835 describes the use of anaphoresis to deposit a photosensitive composition from an emulsion prepared from a solution containing a polychloroprene polymer, a photosensitizer, such as 4,4'-bis-(dimethyl-amino)benzophenone, a stabilizer, such as hydroquinone that prevents the unsaturated polymer from decomposing in solution, and a hardener such as a partially cured resin or other polymer to provide etch resistance, in an 80% butyl acetate 20% methyl ethyl ketone or 80% cyclohexanone 20% methyl ethyl ketone solvent. The emulsion is formed by the addition of an aqueous solution containing a wetting agent, such as a fluorocarbon anionic surfactant, N-methyl-2-pyrolidone and triethyl amine to the first solution. Upon exposure of the photosensitive composition to radiation, the unsaturated polymer crosslinks and the unexposed film is developed with an organic solvent. U.S. Pat. Nos. 3,954,587; 4,029,561; 4,035,273; 4,035,274; 4,039,414; 4,066,523; 4,070,258 and 4,166,017 also disclose coatings that are applied by electrophoresis and are cured by exposure to ultraviolet (UV) light and/or heat. These coatings are intended to provide a permanent protective coating or to improve the appearance of the article to be coated. These patents do not disclose or suggest that such coatings are useful as photoresists and in fact they are not suitable for such use. U.S. Pat. No. 3,844,919 relates to the electrodeposition of a permanent photoconductive material prepared from a photoconductive zinc oxide, an electrically insulating resin, such as an acrylic resin, and an organic solvent or water.

U.S. Pat. No. 4,414,311 describes the preparation of lithographic printing plates by cataphoretically applying a thin, submicron photosenstive film, from an aqueous solution of a polymeric material having pendant diazonium salts, onto an electrochemically hydrophilized metal surface. The thin film is exposed to UV radiation, developed and inked to form a lithographic printing plate.

Japanese patent application No. 77-11601 describes electrophoretically depositing a photosensitive polymer composition onto a silicate coated metal surface. The photosensitive polymers are soluble or dispersible in an aqueous medium and capable of being anaphoretically deposited on a conductive surface by virtue of containing a neutralized acid groups. The polymers are photosensitive by virtue of containing unsaturated groups that crosslink upon exposure to light. The preparation of these polymers requires at least two steps; either the addition of an acid to a polymer having unsaturated groups or the addition of unsaturated groups to a polymer having acid groups. These resins are illustrated as being formed from an acrylic polymer having pendant hydroxy groups and an isocyanate-containing methacrylate compound. The preparation of these photosensitive polymers is difficult because of the number of separate reactions needed. In addition, the extent to which such polymers can be effectively crosslinked is limited by the number of available unsaturated groups on the polymer or the number of unsaturated groups that can be attached thereto. The number of unsaturated groups that can be attached to the polymer may also effect other desirable properties of the resist such as its aqueous solubility and capability to form high quality films. In addition, photosensitive compositions containing a neutralized acid group are not capable of being used in a cataphoretic deposition process and while the patent mentions cataphoresis, it fails to suggest any composition that can be used to cataphoretically form an aqueous acid developable and strippable resist that is resistant to aqueous base solutions and inorganic acids.

Japanese patent disclosure No. 55(1980)-148491 entitled *Method for Preparing Printed Wiring Boards* discloses using electrophoresis for coating photosensitive substances onto the copper surface of a copper-laminated plate in preparing printed circuit boards, however, this reference does not describe any materials useful for the process or any of the process conditions used therein.

It is an object of the present invention to provide a photosensitive polymeric composition, capable of being deposited directly onto a conductive surface from an aqueous solution or emulsion by electrophoresis, that solves the problems of conventional liquid-type resists and dry film resists.

It is also an object of the invention to provide a photosensitive polymer composition that can be electrophoretically deposited as a uniform film of desired thickness on a conductive surface of regular or irregular surface topography without the need for elaborate and time consuming surface preparation steps and without wasting the photosensitive composition.

It is a further object of the invention to provide a photosensitive polymer composition that can be cataphoretically deposited on a conductive surface as an aqueous base and inorganic acid resistant film than can be developed with organic acids to form highly resolved images.

SUMMARY OF THE INVENTION

A photosensitive polymer composition capable of electrophoretic deposition from an aqueous emulsion or solution as a uniform adherent photosensitive film of desired thickness on a conductive surface and a process for forming an aqueous inorganic acid and base resistant image on the surface is provided. The photosensitive polymer composition useful for electro-deposition on conductive surfaces is formed from an aqueous solution or emulsion containing at least one polymer having carrier groups, a photoinitiator, and a source of unsaturation for crosslinking the film upon exposure of the photoinitiator to actinic radiation. This source of unsaturation preferably is an unsaturated crosslinking monomer, such as for example, a multifunctional unsaturated monomer. Alternatively the source of unsaturation can be present in a polymer present in the photosensitive polymer composition itself. Carrier groups are positively or negatively charged groups or groups that become positively or negatively charged upon reaction with an acid or base, respectively.

Additional objects and features of this invention will become more readily apparent from the detailed description and examples that follow.

BRIEF DESCRIPTION OF THE DRAWINGS

FIG. 1 is a schematic drawing of a "J" shaped copper-laminated flexible circuit board used as a cathode in a cataphoretic process of the invention.

FIG. 2 is a cross-sectional view of the "J" shaped copper-laminated flexible circuit board of FIG. 1.

DETAILED DESCRIPTION OF THE INVENTION

The photosensitive polymer composition useful for electrodeposition is formed from an aqueous solution or emulsion of at least one polymer containing a carrier group, a photoinitiator, and a source of unsaturation for a crosslinking reaction upon exposure of the photoinitiator to actinic radiation. This source of unsaturation preferably is an unsaturated crosslinking monomer, such as for example, a multifunctional unsaturated monomer. Alternatively the source of unsaturation can be in a polymer present in the photosenstive polymer composition. Preferably the photosensitive polymer composition is formed from an aqueous solution or emulsion containing at least one polymer containing a cationic carrier group, a photoinitiator, and an unsaturated crosslinking monomer.

A key aspect of the invention is the selection of a suitable monomer or mixture of monomers to form a polymer or a polymer mixture for the photosensitive polymer composition having a number of desirable properties. The polymer or polymer mixture must be capable of being deposited, from a low viscosity aqueous emulsion or solution by electrophoresis, as a uniform, adherent film on a conductive surface. At least one polymer in the photosensitive polymer composition must possess a sufficient number of carrier groups. These carrier groups are positively or negatively charged groups or groups capable of being positively or negatively charged upon reaction with an acid or base, respectively. The carrier groups, on the polymer or on at least one of the polymers in a polymer mixture, enable the polymer or polymer mixture to be useful in an electrophoretic process and are selected so that the unexposed portion of the resulting film can be easily removed using an aqueous acid or aqueous base developer depending on the charge of the carrier group. The polymer or polymer mixture should be soluble in water, or should possess limited solubility in water to form an aqueous emulsion, for electrophoresis. While polymer solutions can be used with the electrophoretic process of the invention, films formed from aqueous emulsions of the photosensitive polymer composition are preferred. A photosensitive polymer composition containing at least one polymer containing a carrier group, a photoinitiator, and a source of unsaturation for a crosslinking reaction upon exposure of the photoinitiator to actinic radiation can also be used, such as for a photoresist, with conventional film forming techniques, other than electrodeposition, to form a film having the same desirable properties as the films formed on conductive surfaces from the aqueous solution or dispersion by electrodeposition.

The photosensitive polymer composition and the deposited photosensitive polymer film formed therefrom must be capable of being crosslinked when the photoinitiator is activated by exposure to actinic radiation. This crosslinking reaction requires the presence of unsaturated groups in the polymer or polymer mixture, or preferably the presense of at least one unsaturated crosslinking monomer in the photosensitive composition. The incorporation of an unsaturated crosslinking monomer having two or more unsaturated groups in the photosensitive polymer composition, referred to herein as a multifunctional monomer, is preferred in the practice of the invention.

When a polymer film is deposited, from the aqueous solution or emulsion of the photosensitive polymer composition, preferably as by cataphoresis, and crosslinked by exposure to actinic radiation, the crosslinked film must be essentially insoluble in aqueous acids and resistant to etchants, such as those containing inorganic acids, and electroplating baths. At the same time the portions of the film that are not exposed to actinic radiation must be soluble in or easily removable by aqueous organic acids.

Suitable polymers for use in the photosensitive polymer composition of the invention are addition or condensation polymers having carrier groups. Addition polymers having carrier groups prepared from monomers having ethylenic unsaturation are preferred. Polymers containing carrier groups that are useful in the photosensitive polymer composition include acrylic polymers, vinyl polymers other than acrylic polymers, epoxy polymers, polyurethanes, polyesters, and poly-amides. Positively charged carrier groups, or cataphoretic carrier groups, include, for example, quaternary ammonium groups, sulfonium groups and sulfoxonium groups.

Other groups which become positively charged upon reaction with an acid, such as for example amine groups, may also be employed. The acids that are useful to protonate the carrier groups of the polymers include lactic acid, glycolic acid, hydroxyacetic acid, hydrochloric acid, formic acid, acetic acid and phosphoric acid.

Negatively charged carrier groups or anaphoretic carrier groups, include, for example, carboxylic acid groups.

Acrylic polymers containing carrier groups are prepared by the polymerization or copolymerization of acrylic acid, methacrylic acid, the esters or amides thereof, and mixtures of such monomers, provided that at least one such monomer contains a carrier group. An acrylic polymer bearing cataphoretic carrier groups can be prepared by the polymerization of monomers, one of which has a basic amine group, such as 2-(dimethylamino)ethyl methacrylate (DMAEMA), or 3-(dimethylamino) propyl methacrylamide (DMAPMA). Upon reaction with an acid, such as for example lactic acid, the amine groups on the polymer are converted to positively charged amine salts. Similarly, (meth)acrylic acid polymers bearing anaphoretic carrier groups may be prepared from acrylic acid or methacrylic acid monomers alone or with other monomers such as lower alkyl acrylic or methacrylic acid esters where the alkyl group contains from 1 to about 8 carbon atoms, for example methyl methacrylate, butylacrylate, and the like. The pendant carboxylic acids on the poly(meth)acrylic acid polymers are then converted to the negatively charged carboxylate salts by reaction with a base, such as for example sodium hydroxide.

Alternatively, it is also possible to modify polymers having no carrier groups to incorporate such carrier groups. For example, a glycidyl methacrylate polymer can be reacted with an amine to attach amine carrier groups to the polymer chain.

Vinyl polymers, other than the acrylic or methacrylic polymers described above, incorporating carrier groups may also be used. These polymers can be prepared by the polymerization of vinyl monomers such as styrene and substituted styrene, vinyl halides such as vinyl chloride, vinyl esters such as vinyl acetate, and vinyl ethers such as methyl vinyl ether, alone or with other vinyl monomers containing carrier groups such as 2-methylvinylimidazole and vinyl imidazole containing cataphoretic carrier groups.

It is also possible to prepare polymers that are suitable for the practice of this invention from the polymerization of the acrylic and methacrylic monomers together with the other vinyl monomers, provided that at least one of the monomers contains a carrier group.

Epoxy polymers are also useful in the photosensitive polymer composition. They are typically prepared by the reaction of di-epoxides with diols, diamines or dicarboxylic acids. The polymerization of a di-epoxide with a diol can be carried out in the presence of an amine to incorporate cataphoretic carrier groups into the polymer. Anaphoretic epoxy polymers can be prepared from uncharged epoxy polymers by chemical reactions that attach carboxylic acid carrier groups to the epoxy polymers.

Polyurethanes which can be used in the photosensitive polymer composition are typically prepared by the reaction of diisocyanates with diols. Residual isocyanate groups can be reacted with hydroxyamines, such as triethanolamine, to attach an amine carrier group for cataphoretic deposition. Anaphoretic polyurethane polymers can be prepared by reacting residual hydroxyl groups with anhydrides of polycarboxylic acids, such as trimellitic anhydride, to attach acid carrier groups.

Polyesters with terminal carboxylic acid groups are suitable anaphoretic polymers for use in the photosensitive polymer composition. These polymers can be converted to cataphoretic polymers by reaction with primary 2-aminoalcohols, such as 2,2-di(hydroxymethyl)-2-aminoethanol, to form oxazoline carrier groups.

A preferred class of polymers suitable for cataphoresis are prepared by the free radical polymerization in a suitable solvent of esters and/or amides of acrylic acid and/or methacrylic acid, where at least one of the monomers contains a amine carrier group. Suitable solvents for the polymerization include the monopropyl ethers of 1,2-propanediol (such as Propasol ®-P manufactured by Union Carbide Corporation), methyl cellosolve, ethyl cellosolve, butyl cellosolve, cellosolve acetate, methyl carbitol, butyl carbitol, 1,2-dimethoxyethane, diethylene glycol dimethyl ether, isopropanol, propanol, n-butanol, sec-butanol, isobutanol, ethylene glycol, 1,3-propanediol, acetone, methyl ethyl ketone, methyl isobutyl ketone, tetrahydrofuran, ethyl acetate, butyl acetate, 1,4-dioxane, toluene, xylene, acetonitrile, dimethylformamide and dimethylsulfoxide. Solvents that are very soluble in water are preferred.

The polymer or polymer mixture containing the carrier groups must contain from at least about 10 milliequivalents of charged carrier group per 100 grams of the polymer or polymer mixture (in order for the polymer or polymer mixture to be water dispersible and capable of being electrophoretically depositable as a film) to less than about 200 milliequivalents of charged carrier group per 100 grams of polymer or mixture (in order for the electrophoretically deposited film to be capable of being selectively developed without adversely affecting the exposed areas of the film). The milliequivalents of charged carrier group per 100 grams of polymer (meq/100 g) is calculated based on the assumption that each equivalent of acid, in the case of a cataphoretic carrier group, added has protonated each group, such as an amine, on the polymer.

In the case of the cataphoretic polymers containing positively charged carrier groups, it is preferred that the polymer contain from about 20 to about 100 meq/100 g. Even more preferred are cataphoretic polymers containing from about 25 to about 75 meq/100 g.

The molecular weight of the polymers used in the photosensitive polymer composition of the invention should be less than 100,000 weight average molecular weight. When acrylic, methacrylic, or the other vinyl polymers containing carrier groups are used, the weight average molecular weight should range from about 10,000 to about 100,000, and preferably from about 20,000 to about 60,000 weight average molecular weight.

One particularly preferred cataphoretic polymer mixture useful in the photosensitive polymer composition of the invention is formed from about 2 to about 15 weight percent DMAEMA, about 2 to about 43 weight percent ethyl acrylate, and from about 83 to about 55 weight percent methyl methacrylate. These copolymers have a molecular weight of from about 10,000 to about 100,000 and a glass transition temperature of from about 0° C. to about 100° C. When this polymer mixture is formulated as an aqueous emulsion with a crosslinking unsaturated monomer, a photoinitiator and an acid, to protonate the carrier groups, the cataphoretically deposited adherent film formed on a conductive substrate surface is easily developed with an aqueous solution of an organic acid and the exposed areas of the film are resistant to strong inorganic acid solutions and strong aqueous bases.

The preferred photosensitive polymer compositions of the invention are formed by mixing the polymer containing carrier groups with at least one unsaturated monomer so that the photosensitive polymer film formed from the photosensitive polymer composition is capable of being polymerized into a crosslinked polymer by a photoinitiator when exposed to actinic radiation. Unsaturated monomers having two or more unsaturated groups attached to the same molecule, referred herein as multifunctional monomers, are preferred. More preferred are multifunctional monomers having two or more acrylate or methacrylate groups attached to each monomer molecule. The multifunctional monomer is added to the polymer or polymer mixture so that there is sufficient unsaturation to give a Bromine Number of about 35 or greater. A Bromine Number is a generally accepted method used to determine the degree of unsaturation in a sample. The Bromine Number refers to the number of grams of bromine needed to react with all the unsaturated groups in 100 grams of a sample.

Examples of suitable multifunctional monomers include the following: allyl methacrylate; 1,4-benzenediol diacrylate; 1,4-benzenediol dimethacrylate; bis-(acryloxyethyl)phosphate; bisphenol-A diacrylate; bisphenol-A dimethacrylate; 1,3-butanediol diacrylate; 1,3-butanediol dimethacrylate; 1,4-butanediol diacrylate; 1,4-butanediol dimethacrylate; 2-butene-1,4-diol diacrylate; 2-butene-1,4-diol dimethacrylate; butylene glycol dimethacrylate; 1,2,4-butanetriol trimethacrylate; crotyl acrylate; crotyl methacrylate; 1,4-cyclohexanediol diacrylate; 1,4-cyclohexanediol dimethacrylate; decamethylene glycol diacrylate; decamethylene glycol dimethacrylate; diallyl isocyanurate; diallyl itaconate; diethylene glycol diacrylate; diethylene glycol dimethacrylate; di-(3-acryloxyethyl) ether of bisphenol-A; di-(acryloxy-2-hydroxypropyl) ether of bisphenol-A; diallyl fumarate; diisoproprenylbenzene; di-(3-methacryloxyethyl) ether of bisphenol-A; di-(3-methacryloxy-2-hydroxypropyl) ether of bisphenol-A; di-(3-methacryloxy-2-hydroxypropyl) ether of tetrachlorobisphenol-A; di-(3-methacryloxy-2-hydroxypropyl) ether of tetrabromobisphenol-A; di-(3-methacryloxy-2-hydroxypropyl) ether of 1,4-butanediol; di-(3-methacryloxy-2-hydroxypropyl) ether of diphenolic acid; 2,2-dimethyl-1,3-propanediol diacrylate; 2,2-dimethyl-1,3-propanediol dimethacrylate; dipropylene glycol dimethacrylate; ethylene glycol diacrylate; ethylene glycol dimethacrylate; gycerol triacrylate; gycerol trimethacrylate; hexamethylene glycol diacrylate; hexamethylene glycol dimethacrylate; hydrogenated bisphenol-A dimethacrylate; melamine acrylate; methallyl -ethacrylate; N,N'-methylenebisacrylamide; 1,9-nonanediol dimethacrylate; 1,5-pentanediol diacrylate; 1,5-pentanediol dimethacrylate; pentaerythritol tetraacrylate; pentaerythritol tetramethacrylate; pentaerythritol triacrylate; pentaerythritol trimethacrylate; 1-phenyl-1,2-ethanediol dimethacrylate; polyoxyethyl-2,2-di(p-hydroxyphenyl)propane diacrylate; polyoxyethyl-2,2-di(p-hydroxyphenyl)propane dimethacrylate; polyoxypropyltrimethylolpropane triacrylate; 1,3-propanediol diacrylate; 1,2-propanediol dimethacrylate; 1,3-propanediol dimethacrylate; propoxylated bisphenol-A dimethacrylate; tetraethylene glycol diacrylate; tetraethylene glycol dimethacrylate; 1,3,5-triacryloylhexahydro-s-trazine; triethylene glycol diacrylate; triethylene glycol dimethacrylate; 1,3,5-isopropenylbenzene; trimethylolethane triacrylate; trimethylolpropane diallyl ether mono-methacrylate; trimethylolpropane triacrylate; trimethylolpropane trimethacrylate; 2,2,4-trimethyl-1,3-pentanediol dimethacrylate; tripropylene glycol diacrylate; tris-(2-acryloxyethyl) isocyanurate; and tris-(2-methacryloxyethyl) isocyanurate. Also useful are the acrylate and methacrylate esters of polyalkoxylated compounds such as those described in U.S. Pat. Nos. 3,594,410, 4,180,474 and 4,382,135; polyoxyethylated trimethylolpropane triacrylate and trimethacrylate and similar compounds as disclosed in U.S. Pat. No. 3,380,831; and the esters of 2-acryloxypropionic acid such as those prepared by the Michael addition of acrylic acids as described in co-pending application Ser. No. 329,857.

Preferred unsaturated crosslinking monomers are those where at least one and preferably most of such linkages are conjugated with a double bonded carbon, including carbon double bonded to carbon or to such heteroatoms as nitrogen, oxygen and sulfur. The most preferred crosslinking monomers are those where the ethylenically unsaturated groups are conjugated with esters or amides, such as pentaerythritol triacrylate and the like.

The photosensitive polymeric composition contains a photoinitiator. A photoinitiator is a material that will polymerize the unsaturated groups in the polymer and/or unsaturated crosslinking monomer when exposed to radiation of an appropriate wavelength. Examples of photoinitiators suitable for use in the polymeric composition include the azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18, the disclosure of which is incorporated by reference herein; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoinitiators which are also useful are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators. Also useful with photoinitiators and photoinhibitors are sensitizers as disclosed in U.S. Pat. No. 4,162,162.

The photoinitiators which have been found to be preferred in the photosensitive polymer composition of the invention include: 3-phenyl-5-isoxazolone/benzanthrone; 2-t-butylanthraquinone; 2,2-dimethoxy-2-phenylacetophenone; 1-hydroxycyclohexyl phenyl ketone, and diethoxyacetophenone. Other suitable photoinitiators are disclosed in Nippon Kagaku Kaisha No. 1192-199 (1984) and include 2,4,6,-tris (trichloromethyl)-1,3,5-triazine with 3,3'-carbonyl bis (7-diethylaminocoumarin), 1-methyl-2-benzylmethylene-1,2-dihydronaphthol (1,2d) thiazole, or 9-phenylacridine; 2-mecaptobenzimidazole with 9-phenylacridine; and 3-phenyl-5-isoxazoline with 9-fluorenone or 1-methyl-2-benzylmethylene-1,2-dihydronaphtho (1,2d) thiazole.

General Procedure for Preparing Aqueous Solution or Emulsion of Photosensitive Polymer Composition The preferred photosensitive cataphoretic polymeric compositions of the invention are formed by mixing the polymer solution with the unsaturated crosslinking monomer. The photoinitiator dissolved in a suitable solvent is then added to this solution and the acid, used to protonate the carrier groups, is added to the stirred mixture. After the mixture is completely mixed, water is added. As the water is added, the mixture becomes less viscous and an aqueous emulsion is formed. The solids content of the emulsion can be adjusted by diluting the emulsion with additional water. The relative concentrations of the polymer, photoinitiator, unsaturated monomer and acid are illustrated in Table I where all components are expressed on a weight basis based on 100 parts by weight of the polymer.

TABLE I

|  | Overall | Preferred | Most Preferred |
| --- | --- | --- | --- |
| Polymer | 100 | 100 | 100 |
| Solvent | 0-300 | 0-100 | 0-70 |
| Unsaturated Monomer | 0-100 | 25-75 | 30-50 |
| Photoinitiator | 1-20 | 2-10 | 3-8 |
| Acid | 0.5-10 | 1-5 | 1-3 |
| Water | 400-4000 | 500-3100 | 900-2600 |

General Electrophoretic Procedure

The process of cataphoretically depositing a photosensitive polymeric film from the aqueous solution or emulsion is accomplished using the following general procedure. A substrate having a conductive surface such as a circuit board material having copper cladding on each side, may be scrubbed with an abrasive cleaner, dried with air and lowered into the aqueous emulsion or solution to serve as the cathode. Preparing the substrate by scrubbing with an abrasive cleaner is not necessary to obtain good adhesion of the photosensitive film and can be eliminated from the process if desired. Ar inert counter electrode, such as stainless steel, is used as the anode. The anode is also submerged into the aqueous emulsion or solution such that the two electrodes are parallel to each other and separated by a fixed distance of at least about 0.5 centimeters. The electrodes are connected to a constant voltage, direct current power supply. A potential on the order of one hundred volts is then applied. The amount of applied voltage and the time that the voltage is applied determines the thickness of the deposited film. The time that the voltage is applied should be less than about one minute, and preferably as short as from about 5 to 15 seconds. A decrease in the current, as monitored on a strip chart recorder during the time the voltage is applied, to about 10 to 15 percent of the initial current level indicates complete electrodeposition. The power source is then disconnected and the cathode is removed from the aqueous emulsion or solution, rinsed with water and dried with air or nitrogen. The film can optionally be baked at about 100° C. for about 10 minutes to reduce tack and increase abrasion resistance of the film if desired. The thickness of the deposited film or coating may be measured such as by an Alpha Step ® profiler manufactured by Tencor Instruments. The profiler measures the thickness of the film as follows: A small section of the film is scraped away from the substrate and the sample is positioned in the profiler so that the stylus of the profiler is drawn along the copper cladding on the substrate surface and from the substrate surface onto the surface of the deposited film. The profiler monitors the distance that the stylus travels as it climbs from the surface of the copper cladding to the surface of the film. This distance is equal to the thickness of the deposited film.

This general procedure is also suitable for anaphoretic deposition using the anaphoretic photosensitive polymer composition of the invention using the conductive surface as the anode and the inert counter electrode as the cathode.

During cataphoretic electrodeposition, the polymers containing the positively charged carrier groups migrate toward the cathode surface while water is being electrolyzed at the cathode forming hydrogen and hydroxide ions. Due to hydroxide formation, the pH at the cathode surface is much higher than in the bulk of the solution or emulsion. When the polymer particles reach the cathode surface, the positively charged carrier groups, such as the protonated amine groups of the polymer, react with the hydroxide ions to form water and neutral carrier groups, such as neutral amine groups, on the polymer. These unprotonated carrier groups are not capable of stabilizing polymer particles in the emulsion or the solution and the polymer particles precipitate onto the cathode surface, coalescing with other like particles and forming a film on the cathode surface. The film acts as an electrical insulator for the cathode, and as the film grows in thickness the resistance between the two electrodes increases and the current drops. This drop in current reduces the deposition rate for additional film until the growth of the film eventually stops. Therefore, when the initial current is reduced to about 10 to 15 percent of its initial level effectively complete electrodeposition has occurred. The growth of the film is therefore self-limiting and results in an even, uniformly thick coating or film over the entire conductive substrate surface.

EXPOSURE AND DEVELOPMENT OF THE FILM

The photosensitive film coated substrate is then exposed and developed to transfer an image, such as a pattern delineated on a photomask, onto the substrate. Exposure of the film can be carried out at atmospheric pressure (air) by placing the photomask in contact with the film and exposing the film, through the mask, to the desired radiation. Exposure of the film is preferably carried out under partial vacuum by placing the film coated substate and photomask in a frame that is capable of sustaining at least a partial vacuum and which has a window that is transparent to the exposing radiation. When the vacuum is applied, the seal that the window rests on is compressed so that the window presses the mask firmly onto the photosensitive film. The exposing radiation, such as unfiltered ultraviolet light produced by a mercury lamp having an average wavelength of about 366 nanometers, can then be used to expose the photosensitive film through the photomask. The photomask used in the illustrative examples described hereinafter was a Stouffer Resolution Guide (1-T) made of a transparent film having an opaque pattern. Part of the pattern consists of ten black or opaque lines, in a side-by-side pattern, which are tapered so that the width of the lines ranges from a distance of about 5000 micrometers to about 10 micrometers. The space between the lines at any point is about 1.5 times the width of the lines at that point, for example, if the lines are 300 micrometers in width, the space between the lines is about 450 micrometers. Another part of the photomask has a negative image formed by transparent lines separated by opaque spaces on a pattern as described above. Calibration bars which cross the lines at several places serve to indicate the width of the lines.

The power of the exposing radiation that reaches the film can be measured before the exposure of the film. A Hybrid Technologies Group Power Meter (Model 100) was used to measure the exposure power at about 366 nanometers. This meter uses a photocell with a filter that filters out wavelengths other than those of about 366 nanometers. The meter is placed under the exposure lamp at a position normally occupied by the sample to be exposed. The signal from the photocell is converted to a digital readout in power units (milliwatts per square centimeter). The power can then be converted to energy units (millijoules per square centimeter) by multiplying the power units by the exposure time (seconds).

Following exposure and the removal of the photomask, the photosensistive film is developed, by subjecting the film to a developing solution either by spraying the developer onto the film or by immersing the film coated substrate into a developing solution. The developer solutions that have been found to be useful for developing the cataphoretically deposited negative photoresist films of the invention include from about 10 to about 15 weight percent aqueous solutions of acetic, lactic, glycolic acids, formic, and succinic acid and the like, with acetic acid being the preferred developer. In all cases, the developer solutions were used at temperatures ranging from about 20° C. to about 50° C.

During immersion development of cataphoretically deposited negative resists of the invention, the developing solution was stirred gently for a sufficient time to cause complete protonation of the amine or other carrier groups on the polymer in the unexposed areas making these film areas sufficiently hydrophillic and soluble in, or swellable by, warm water at temperatures of from about 45° to about 50° C. so that the developed areas are easily removed from the surface.

Spray development may be conducted by pumping the developer through a spray nozzle onto the surface of the exposed film coated substrate. The unexposed film is then removed by the sprayed developer. Excess developer may be removed from the surface by rinsing with water. Following development, the substrate surface is then dried with air or nitrogen.

The exposed, crosslinked, areas of the film are more resistant to the reaction with the developer and are much less soluble, even after some limited reaction with the developer, than the unexposed areas. During the time that is required to completely remove the unexposed portions of the film, the exposed areas remain essentially unaffected.

ETCHING

The conductive surface of the substrate not covered by the exposed, crosslinked, resist film is then etched and removed using common oxidizing agents. For example, with a substrate having a copper metal surface, a solution of ferric chloride, cupric chloride or commercially available etchants such as Shipley Company Neutra-Etch ® V-1 (alkaline ammonia) or Hydroetch ® 536 can be used. Other etching solutions and etching techniques which are commonly used are described in *The Printed Circuit Handbook*, C. F. Coombs, Jr., pages 8-11 to 8-27.

STRIPPING

After etching, the photosensitive film may be stripped to reveal lines of unetched metal on the substrate. Stripping the photosensitive film may be carried out by immersing the exposed photosensitive film coated substrate in a stripping solution or by spraying the stripping solution on the resist, similar to the techniques described above in connection with the development step, until the exposed film is removed.

The aqueous solutions which may be used to strip the resist are similar to those used to develop the resist. They can also contain minor amounts of surfactants and other additives. Suitable aqueous stripping solutions include 5 weight percent solutions of succinic acid, butyl carbitol or butyl cellosolve. These stripping solutions may be used at elevated temperatures, for example, about 50° C.

RESOLUTION

The resolution of the developed photosensitive film on the surface or image is defined as the minimum width of lines and spaces, corresponding to the alternating opaque and transparent lines on the photomask, that are reliably transferred to the photosensitive film image after etching and stripping. Lines having a continuous surface of unetched metal on the surface are considered resolved. The resolution as actually reported is the nominal width of the line in the photomask used to produce that line although the actual width of the etched line may be slightly less due to slight undercutting of the exposed film by the etchant.

The use of the photosensitive polymer composition to electrophoretically deposit an inorganic acid resistant, negative photoresist, which can be further processed as described generally above, is described in greater detail in the examples that follow.

The photosensitive polymer composition of the invention can also be used as a photoresist for chemical milling and as a solder mask for printed circuit boards. In chemical milling, a metal workpiece that is to be milled can be electrophoretically coated with the photosensitive polymer composition. The areas of the coated workpiece which are desired to be protected during milling are exposed to ultraviolet light. The unexposed resist is then removed by a developer leaving bare metal areas. The bare metal areas of the workpiece are then etched with a solution that doesn't affect the photoresist.

When the photosensitive polymer composition is used as a solder mask for printed circuit boards, the conductive lines of a finished printed circuit board are coated with the photosensistive polymer composition. The coating is exposed in all areas except where a component is to be soldered to the circuit. The unexposed film is developed to expose the bare metal portion of the conductive line where the solder is to be applied. During soldering, the solder will adhere to the bare metal but will not contact other areas of the conductive lines coated by the exposed film. The solder resist film thereby prevents shorts, caused by solder bridging the conductive lines, and protects the lines against corrosion and abrasion.

The photosensitive resin can be used for the preparation of printing plates. The printing plate can be coated with the photoresist film, exposed through a mask with transparent areas corresponding to the areas to be coated with ink. The resist is developed to remove the unexposed resist. The plate bearing the resist image is inked with an ink that adheres to resist but not to the plate surface. The inked plate is pressed against the paper to transfer the ink to the surface of the paper. Alternatively, the plate bearing the resist image can be etched to partially remove areas not covered by the resist. The resist is then stripped and the plate is inked, coating the areas that were not partially removed by the etching. The plate is pressed against the paper to transfer the ink to the surface of the paper.

In addition, the photosensitive composition can also be used advantageously to prepare screens for cathode ray tubes by electrophoretically coating the photosensitive polymer composition onto a conductive opaque surface. Cathode ray tube surfaces are normally not planar but curved, and obtaining a uniform photoresist coating on such a surface can be difficult to accomplish using conventional liquid resists. A photomask, having opaque areas corresponding to the areas that will be transparent in the final screen, is placed over the photosensitive film and the film is exposed and developed. The opaque surface not protected by the film is etched down to the transparent support and the screen is then processed in a conventional manner to make a cathode ray tube.

The photosensitive polymeric composition of the invention can also be used with printed circuit boards formed by electroplating a dissimilar material, such as a tin/lead alloy, on the copper foil substrate not protected by the exposed photosensitive film. Following electroplating, the film is stripped to reveal the bare copper foil that is then etched using an etchant that doesn't attack the dissimilar electroplated metal image.

Additional uses of the photosensitive polymer composition of the invention will be readily apparent to those having ordinary skill in this art from the illustrative examples that follow. These examples are provided to illustrate the invention and should not be construed to limit its applicability. All percentages used in the examples are on a weight basis unless specifically stated otherwise.

EXAMPLE 1

Preparation of Photosensitive Polymeric Composition

Four hundred grams of Propasol-P ® solvent was placed in a four neck round bottom flask fitted with a mechanical stirrer, nitrogen inlet tube, condenser and thermometer. Nitrogen gas was bubbled through the solvent and exhausted through an oil bubbler attached to the condenser to degas the solvent and flush the air from the reaction vessel. The nitrogen inlet tube was raised above the level of the solvent and a flow was maintained to keep a positive pressure of nitrogen in the flask throughout the reaction. A thermostatically controlled heating mantle was fitted to the underside of the flask and the solvent was heated to 105° C. A mixture of 48 grams 2-(dimethylamino)ethyl methacrylate, 408 grams of methyl methacrylate and 162 grams of butyl acrylate and 6.2 grams of t-butyl peroctoate, a free radical initiator, was added dropwise over a four hour period to the stirred reaction vessel. An additional 0.6 grams of t-butyl peroctoate (10% of the originally added amount) was added to the reaction vessel 20 minutes after the addition of all the monomers. The heating and stirring was maintained for another 30 minutes and then discontinued. The polymer solution formed had a solids content of 61 weight percent indicating the essentially complete conversion of the monomers to polymer.

An aqueous emulsion was then prepared by stirring 16.4 grams of the polymer solution with 5.0 grams of a multifunctional monomer, pentaerythritol triacrylate, 1.9 grams of a 21 weight percent solution of 2-t-butyl-anthraquinone photoinitiator in glyme (1,2-dimethoxyethane). To the above mixture was then added stepwise 0.2 milliliters of 85 weight percent aqueous lactic acid. Deionized water was then added slowly with stirring until the mixture was completely dispersed and until the viscosity of the mixture was noticeably reduced. Deionized water was added to make a total of 150 g of the photosensitive polymeric emulsion having a solids content of about 10 weight percent.

EXAMPLE 2

Electrophoretic Deposition of Photosensitive Emulsion

A printed circuit board, having a thickness of one sixteenth inch, measuring 2.5 centimeters by 10 centimeters and having one ounce per square foot of copper clad to each side, was scrubbed with an abrasive cleaner (Shipley Company Scrub Cleaner 11), dried with a stream of air and lowered about 5 centimeters into the photosensitive polymeric emulsion prepared in Example 1. A stainless steel electrode of the same size as the printed circuit board was also submerged in this emulsion to form an electrolytic cell. The two electrodes were positioned parallel to each other separated by a distance of 2.5 centimeters. The electrodes were connected to a DC power supply, the stainless steel electrode being the anode and the circuit board surface being the cathode. An electrical potential of 100 volts was applied for 12 seconds. The temperature of the emulsion was 30° C. and the initial current density was 15 milliamps per square centimeter. The power supply was then disconnected and the coated board was removed from the emulsion, rinsed with water and dried with nitrogen. The thickness of the coating was 5 micrometers as measured using the Alpha-Step ® Profiler.

EXAMPLE 3

Exposure and Development of Photosensitive Film

The film coated printed circuit board prepared in Example 2 was placed in a vacuum frame with a Stouffer Resolution Guide photomask and exposed with 1 mW/cm² of unfiltered 366 nm ultraviolet light. The exposure time was 3 minutes and the exposure power as measured by a Hydrid Techologies Group Power meter (Model 100) was about 1 milliwatt per square centimeter.

The exposed film was then developed by immersion in an aqueous solution of 15 weight percent acetic acid at 45° C. with a constant back and forth motion of the substrate for two minutes. The substrate was then washed under a stream of warm (45° C.) water for 10 to 15 seconds and dried with a stream of nitrogen.

Lines and spaces of 25 micrometers in the Stouffer Resolution Guide were accurately reproduced in the imaged photoresist pattern.

EXAMPLE 4

Etching

Printed circuit boards prepared according to example 3 were then etched by submerging each board in one of the following inorganic etchants while stirring back and forth until the bare copper, not protected by the photoresist, was etched away revealing the insulating material of the board. The condition of the etched printed circuit board after etching with each etchant was visually inspected to determine if the photosensitive film was attacked by the etchant or if the film failed to adequately protect the copper, under the film, from the etchant. The results of the etching tests are shown in Table 1.

TABLE 1

| Etchant | Etching Temperature °C. | Resolution, Micrometers | Film Condition After Etching |
| --- | --- | --- | --- |
| Ferric Chloride[1] | Ambient | 75 | No apparent change |
| Cupric Chloride[2] | 52–54 | 75 | No apparent change |
| Shipley Company Neutra-Etch V-1 | 52–53 | 75 | No apparent change |
| Shipley Company[3] Hydro-Etch 536 | 52–53 | 125 | Resist yellowed slightly and resist lines less than 100 microns wide peeled away from copper during etching |

[1]Ferric Chloride etchant was a 38 weight % solution having 1.402 specific gravity, 42 Baume, 4.45 lb/gal density, 530 g/L and 3.27 molarity at 20 to 25° C. as described in the Printed Circuit Board Handbook, pg. 8-20, Table 8.5. Optimum FeCl₃ solution.
[2]Cupric Chloride etchant was a $CuCl_2.2H_2O$ at 2.2 M, 30 mL/gal HCl (20° C. Be), 4M NaCl with water to make up 1 gallon as described in Printed Circuit Handbook, pg. 8-15, Table 8.2-2.
[3]Another developed photosensitizer film board was heated with a stream of air at temperature of 170° C. for about 1 minute prior to etching with Shipley Hydro-Etch 536 to produce etched lines with 75 micrometer resolution. The finer lines of this pattern had less of a tendency to peel away from the copper substrate than the sample illustrated in Table 1 that had not been heated prior to Hydro-Etch 536.

EXAMPLE 5

Stripping

The Hydro-Etch 536 printed circuit board described in Example 4 (footnote 3) that had been heated prior to etching was placed in an aqueous stripping solution containing 15% acetic acid at 60° C. for 8 minutes. The photosensitive film was softened and was easily brushed away from the surface leaving a clean copper surface.

EXAMPLE 6

Solder Plating

A printed circuit board containing the developed photosensitive polymer film of Example 3 was electroplated with solder in the areas not covered by the photosensitive film for 10 minutes at 10 milliamps per square centimeter to produce a layer of solder about 5 micrometers thick. The film was visually examined and found to be essentially unaffected by the plating process. No pinholes in the film which would have resulted in the formation of solder in undesired areas were found by inspection under 70X magnification.

EXAMPLE 7

Stability of Photosensitive Polymer to Plating Baths

A standard copper plating bath and standard solder plating bath were prepared according to the *Printed Circuit Handbook*, C. F. Coombs, Jr., pages 7-16 to 7-18 and 7-19 to 7-22, respectively. The resistance of the exposed photosensitive polymeric film was tested by placing a printed circuit board, prepared according to Example 3, in the copper plating bath for 60 minutes and then in the solder plating bath for 30 minutes. The film was then inspected for any substantial change in hardness and adhesion or for signs of attack by the plating bath or changes in the image. The printed circuit boards remained essentially unchanged in the plating baths and no pinholes were detected by inspection under 70X magnification.

EXAMPLE 8

Photosensitive Polymer Composition and Imaging

A photosensitive polymer composition was prepared by formulating an aqueous emulsion using the same materials and procedures as in Examples 1 and 2 except that 4.0 grams of trimethylolpropane trimethacrylate was substituted for the pentaerythritol triacrylate multifunctional monomer. The aqueous emulsion was then cataphoretically deposited onto a printed circuit board. After 12 seconds at 100 volts and at 20° C., the coating thickness was measured to be 5 micrometers. The film coated board was exposed under vacuum using a Stouffer resolution guide and mercury lamp (UV 366 nanometers) for 3 minutes at an intensity of 1 milliwatt per square centimeters and developed with an aqueous solution of 15 weight percent acetic acid at 40° C. for 2.5 minutes. Lines and spaces of 30 micrometers resolution were obtained in the photoresist image on the copper.

EXAMPLE 9

Photosensitive Polymer Composition and Imaging

Example 8 was repeated with the following modifications: 5.0 grams of trimethylolpropane triacrylate multifunctional monomer was used instead of 4.0 grams of trimethylolpropane trimethacrylate in preparing the photosensitive polymer composition. Cataphoretic deposition at 21° C. for 12 seconds resulted in a film of 4 microns thickness. The film was exposed, under vacuum using the Stouffer resolution guide, to UV radiation (366 nanometers) for 3 minutes at 1 milliwatts per square centimeter. The unexposed film was developed for 3.5 minutes at 30° C. in an aqueous solution of 15 percent acetic acid. Lines and spaces of 30 micrometers were resolved in the imaged photoresist image on the copper.

EXAMPLE 10

Photosensitive Polymer Composition and Imaging

Example 1 was repeated this time by using 1.9 grams of a 21 percent solution of Irgacure 651 ®(2,2-dimethoxy-2-phenylacetophenone) manufactured by Ciba-Geigy in glyme (1,2-dimethoxyethane) as the photoinitiator in place of the 2-t-butylanthraquinone. Electrophoretic deposition for 12 seconds and 20° C. was followed by exposure under vacuum through a Stouffer Sensitivity Guide mask for 2 minutes at 1 milliwatt per square centimeter. Development was accomplished by using a 15 weight percent acetic acid aqueous solution for 2 minutes at 40° C. Another sample was exposed through a Stouffer Resolution Guide and developed as described above. Lines and spaces of 30 micrometers in width were resolved in the photoresist pattern on the copper substrate.

EXAMPLE 11

Photosensitive Film Coating of Unscrubbed Surfaces

This example illustrates the utility of the photosensitive polymer composition of the invention for coating unscrubbed conductive surfaces and compares the coating with a scrubbed surface as described in example 2. (Sample 1)

A copper clad substrate having a chromate conversion coating (Sample 2) typical of those used as the inner layers of multilayer printed circuit boards, measuring 10 cm by 3.75 cm by 0.03 cm and clad with a 35 micron thick layer of copper on each side was used but was not cleaned or scrubbed.

Sample 3 was an inner layer substrate, as in Sample 2, that had been scrubbed. The copper surface was converted to black oxide as is typically commercially done during the preparation of multilayer boards to increase adhesion between the layers.

Sample 4 was a smooth, high purity, copper foil (Baker 1-1714, 0.005 inches thick) which did not have a chromate conversion coating; the surface was slightly oxidized and smudged by handling. The surface was not scrubbed or cleaned.

Sample 5 was a sample of a dry film laminated onto a copper substrate (Kepro Sl-12126) with the cover sheet removed. This sample was included for comparative purposes.

Samples 1-4 were each cataphoretically coated with the photosensitive polymer film and samples (1-3) were exposed for 3 minutes of 1 Milliwatt per square centimeter (mW/cm$^2$) through the resolution guide photomask either in air (ambient atmospheric pressure) or under vacuum as indicated in Table 2. Samples 1-3 were then developed using an aqueous acetic acid (15%) developer at 40° C. and etched with cupric chloride (as in Example 4) to produce an image in the copper substrates. The adhesion of the unexposed film of all Samples 1-5 to the surface was measured using ASTM D3359-78 (measuring Adhesion by Tape Test) and the adhesion and resolution achieved is illustrated in Table 2.

TABLE 2

| Sample | Substrate | Adhesion[1] | Exposure Condition | Resolution of Etched Image (micrometers) |
|---|---|---|---|---|
| 1 | Scrubbed | 5 | vacuum | 75 |
| 2 | Inner Layer | 2 | air | 75 |
| 3 | Black Oxide | 5 | vacuum | 75 |
| 4 | Unscrubbed Foil | 5 | — | — |
| 5 | Dry Film | 4 | — | — |

[1]Adhesion rated as 0-5, 0 being lowest and 5 being highest as determined by ASTM D3359-78.

EXAMPLE 12

Determination of Solids Contents of Photosensitive Film

The same materials and procedures for formulating the aqueous emulsion of the photosensitive polymeric composition of Example 1 were employed with the following changes:

| Polymer Preparation | | |
|---|---|---|
| Solvent: | Propasol ® -P | 133 grams |
| Monomers: | 2-(Dimethylamino)ethyl methacrylate | 50 grams |
|  | Methyl methacrylate | 150 grams |
|  | Butyl methacrylate | 50 grams |
| Initiator: | t-butyl peroctoate | |
|  | added with monomers | 2.8 grams |
|  | added after monomer addition | 0.0 grams. |

The final solids content of the polymer solution was 58 weight percent indicating a polymerization conversion greater than 95 percent. The aqueous emulsion was prepared from:

| | |
|---|---|
| Polymer solution | 17.5 grams |
| Pentaerythritol triacrylate | 5.0 grams |
| 21% 2-t-butylanthraquinone in glyme | 1.6 grams |
| 89% aqueous lactic acid | 0.2 milliliters |
| water to make | 150 grams total |

Two samples of copper foil measuring 4 centimeters by 8 centimeters by 0.013 centimeters each, were dried for 2 hours at 100° C. and weighed. Approximately half of each sample was electrodeposited with the aqueous emulsion at 21° C. using a potential of 100 volts for 12 seconds. Each sample was rinsed with water and dried with nitrogen gas. The samples were each weighed again to determine the weight of the deposited film. They were then dried at 90° C. in a forced air oven for 1 hour until the weight was constant and weighed again to determine the weight of nonvolatile solids in the films. The nonvolatile solids were found to be equal to 90 to 93% of the weight of the film respectively before the films were baked.

EXAMPLE 13

Thickness of Film as Function of Electrophoretic Temperature

This experiment was conducted to determine the effect of the temperature of the photosensitive composition on the thickness of the electrophoretically deposited film formed on a surface therefrom. This experiment utilized the photosensitive emulsion prepared in Example 1 and the electrodeposition procedure described in Example 2 except for changing the temperature of the emulsion. The thickness of the film at each temperature was recorded and presented in Table 3.

TABLE 3

| Temperature (°C.) | Thickness of Coating (micrometers) |
|---|---|
| 5 | 13 |
| 10 | 7 |
| 15 | 3 |
| 20 | 3 |
| 25 | 4 |
| 30 | 7 |
| 35 | 14 |
| 40 | 24 |

The experiment demonstrates that the thickness of the electrophoretically deposited film can be adjusted by changing the temperature of the photosensitive polymer composition during electrophoresis.

EXAMPLE 14

Thickness of Film as Function of Electrophoretic Potential

This experiment was conducted to determine whether the thickness of the deposited photosensitive film can be controlled by varying the electrophoretic potential. The polymer solution and emulsion were prepared according to Example 1.

Electrophoretic deposition of printed circuit boards were conducted at 35° C. for 12 seconds using the aqueous emulsion with various applied electrical potential. The thickness of the film as a function of the electrophoretic potential (volts) and initial current density (milliamperes per square centimeter) is presented in Table 4.

TABLE 4

| Potential (volts) | Initial Current Density (mA/cm$^2$) | Film Thickness microns |
|---|---|---|
| 50 | 12 | 4 |
| 100 | 24 | 14 |
| 150 | 34 | 30 |

This demonstrates that both the temperature of the aqueous emulsion (Example 13) and the electrophoretic potential applied (Example 14) have a significant effect on the thickness of the deposited film.

EXAMPLE 15

Demonstration of Uniform Film Thickness

The materials and procedures of Example 1 were used with the following changes:

| Solvent: | Propasol-P | 167 grams |
|---|---|---|
| Monomers: | 2-(Dimethylamino)ethyl methacrylate | 20.0 grams |
| | Methyl methacrylate | 199 grams |
| | Ethyl methacrylate | 42.5 grams |
| Initiator: | t-butyl peroctoate | |
| | added with monomers | 2.7 grams |
| | added after monomer addition | 0.3 grams |

The final solids content of the polymer solution was 60% indicating essentially complete polymerization of the monomers.

| Aqueous Emulsion: | |
|---|---|
| Polymer solution | 16.6 grams |
| Pentaerythritol triacrylate | 5.0 grams |
| 21% 2-t-butylanthraquinone in glyme | 1.9 grams |
| 89% aqueous lactic acid | 0.2 milliliters |
| water to make | 150 grams total |

Electrophetic coating was conduction using a printed circuit board cathode (conductive coating on both sides) and a stainless steel anode each measuring 8 centimeters by 9 centimeters separated by 0.7 centimeters at 21° C. at initial current density of 35 mA/cm$^2$ at 100 volts for 12 seconds. The thickness of the photosensitive polymer film on the printed circuit board was measured at the center of the board and at each of the four corners as illustrated in Table 5.

TABLE 5

| Location | Film Thickness, Micrometers |
|---|---|
| Center | 13.5 |
| Upper left corner[1] | 13.0 |
| Lower left corner | 13.0 |
| Upper right corner | 13.0 |
| Lower right corner | 14.0 |

[1]Upper and lower refers respectively to the portion of the board closest to the air and farthest from emulsion interface.

This demonstrates that very little variation in thickness across the surface of the substrate was found using the electrophoretic deposition process with the photosensitive polymer composition of the invention.

EXAMPLE 16

Use of Organic Solvent Developer

The materials and procedure of Example 1 were repeated as follows.

| Solvent: | Propasol P | 150 grams |
|---|---|---|
| Monomers: | 2-(Dimethylamino)ethyl methacrylate | 6.3 grams |
| | Methyl methacrylate | 96 grams |
| | Butyl methacrylate | 31.5 grams |
| Initiator: | t-butyl peroctoate | |
| | added with monomers | 1.6 grams |
| | added after monomer addition | 0.16 grams |

Final solids content of the polymer solution was 48 weight percent indicating essentially complete conversion of monomers to polymer.

| Aqueous Emulsion: | |
|---|---|
| Polymer solution | 21.0 grams |
| Pentaerythritol triacrylate | 5.0 grams |
| 21% 2-t-butylanthraquinone in glyme | 1.9 grams |
| 89% aqueous lactic acid | 0.2 milliliters |

-continued

| Aqueous Emulsion: | |
|---|---|
| water to make | 150 grams total |

Electrophoretic coating at 100 volts, 13 mA/cm² initial current density, for 12 seconds at 21° C. resulted in 4 micron thick film. Exposure was conducted using a Stouffer resolution guide under vacuum at 1 mW/cm² and 4 minutes with UV light at 366 nanometers. Development was complete in 10 seconds using toluene at 21° C. and resulted in lines and spaces of 30 micrometer resolution.

EXAMPLE 17

DMAPMA Photosensitive Polymer Composition

This example illustrates the use of 3-(dimethylamino) propyl methacrylamide, instead of DMAEMA as used in Example 1, to formulate the photosensitive polymer compositions and to prepare images from this composition by electrophoresis. The materials and procedures of Examples 1–4 were used with modifications as indicated.

| Polymer Preparation: | | | |
|---|---|---|---|
| Solvent: | Propasol-P | 133 | grams |
| Monomers: | 3-(Dimethylamino)propyl/ methacrylamide | 18 | grams |
| | Methyl methacrylate | 130 | grams |
| | Butyl methacrylate | 52 | grams |
| Initiator: | t-Butyl peroctoate | | |
| | added with monomers | 2.2 | grams |
| | added after monomer addition | 0.2 | grams |

The final solids content of the polymer solution was 57% and the polymerization yield was about 95%.

| Emulsion Preparation: | |
|---|---|
| Polymer solution | 17.8 grams |
| Pentaerythritol triacrylate | 5.0 grams |
| 17% 2-t-Butyl anthraquinone in glyme | 2.4 grams |
| 89% aqueous lactic acid | 0.2 grams |
| water to make | 150 grams total |
| Electrophoresis: | |
| Time | 12 seconds |
| Temperature | 20° C. |
| Coating thickness | 5 microns |
| Exposure | |
| Mask | Stouffer Resolution Guide |
| Conditions | vacuum |
| Light intensity | 1 mW/cm² |
| Time | 3 minutes |
| Development | |
| Developer | Aqueous solution 15% acetic acid |
| Temperature | 30° C. |
| Time | 1 minute |

Lines and spaces of 30 microns were resolved in the photoresist pattern on the copper coated substrate.

Stability to Plating Bath

The stability of the exposed, developed photoresist image to copper and tin/lead plating bath was determined according to the procedure of Example 7. After 30 minutes in the copper plating bath, the resist softened slightly but showed no further change during the remaining 30 minutes nor was any additional change noted during an additional 30 minute immersion in a tin/lead plating bath.

Resistance to Etching

Copper clad substrates with an exposed, developed photoresist image of the invention were subjected to etching as described in example 4. Etching with the ferric chloride, cupric chloride and Shipley Neutra-Etch V-1 produced lines and spaces of 75 microns or less. The ferric chloride and cupric chloride etchants softened the resist slightly but did not lead to decreased performance while the resist etched with Neutra Etched showed no softening. The sample etched with Shipley Hydro-Etch 536 showed resolved lines and spaces of 100 microns with some softening and unacceptable blistering of the film.

EXAMPLE 18

Anaphoretic Deposition of Photosensitive Polymer Composition

This example illustrates the use of the photosensitive polymer composition in an anaphoretic coating process to produce a photoresist film that is developed with aqueous base.

The materials and procedures described in Example 1 were used with the exceptions noted.

| Polymer preparation: | | | |
|---|---|---|---|
| Solvent: | Propasol-P | 167 | grams |
| Monomers: | Methacrylic acid | 37.5 | grams |
| | Methyl methacrylate | 125 | grams |
| | Butyl methacrylate | 87.5 | grams |
| Initiator: | t-Butyl peroctoate | | |
| | added with monomers | 2.7 | grams |
| | added after monomer addition | 0.3 | grams |

The final solids of the polymer solution was 60%, indicating that the conversion of the monomers to the polymer was complete.

| Emulsion preparation: | |
|---|---|
| Polymer solution | 16.4 grams |
| Pentaerythritol triacrylate | 5.0 grams |
| 21% 2-t-Butylanthraquinone in glyme | 1.9 grams |
| 1 N sodium hydroxide | 5.0 grams |
| Water to make | 150 grams total |
| Electrophoretic coating: | |

The procedure described in Example 2 was followed except that the film was applied by anaphoresis. The copper clad substrate to be coated was used as the anode and the stainless steel electrode was used as the cathode. The coating was carried out at 100 V.

| Time | 12 seconds |
|---|---|
| Temperature | 20° C. |
| Initial current density | 20 mA/cm² |
| Thickness | 3 microns |
| Exposure | |
| Mask | Stouffer resolution mask |
| Conditions | Vacuum |
| Light intensity | 1 mW/cm² |
| time | 3 minutes |
| Development | |
| Developer | Aqueous solution of 1% potassium carbonate |
| Temperature | 20° C. |

| Time | 30 seconds |
|---|---|

Lines and spaces of 30 microns were resolved in the photoresist pattern on the copper.

EXAMPLE 19

Electrodeposition on Non-Planar Substrate

In this experiment, a non-planar substrate was electrophoretically coated with the photosensitive polymer composition to demonstrate that irregular shaped substrates can be easily coated. The polymer and emulsion was prepared as described in Example 1. A piece of flexible circuit board measuring 12.5 cm ×2.5 cm×0.18 mm with 37 microns of copper laminated to each side was bent twice at right angles at 8 cm and 10 cm along the longest dimension to form a "J" as shown in FIG. 1. The substrate was then used as the cathode and positioned in the cell such that the stem of the "J" (between points 1 and 2) was 2.5 cm from the anode and the hook of the "J" (between points 2 and 3) was pointing away from the anode. The electrophoretic coating was carried out at 100 V for 30 seconds at 35° C. the thickness at each horizontal and vertical side (as shown in FIG. 1) was measured. The results are recorded in the table below.

TABLE

| Surface | Thickness (microns) |
|---|---|
| a | 17 |
| b | 17 |
| c | 19 |
| d | 19 |
| e | 18 |
| f | 17 |

These data show that irregularly shaped objects can be coated with an essentially uniform coating of the photoresist.

What is claimed is:

1. A process for forming a negative polymer image on a conductive surface comprising:
   (a) electrophoretically depositing a uniform film on said surface from a photosensitive polymer composition comprising an aqueous solution or emulsion of at least one polymer free of ethylenic unsaturation and having charged carrier groups, a photoinitiator, and an unsaturated crosslinking monomer;
   (b) exposing portions of said film to a source of actinic radiation; and
   (c) developing the unexposed film using an aqueous solution to form a crosslinked negative polymer image on said surface, said image being resistant to etchants and plating solutions.

2. The process of claim 1 further comprising etching the surface areas not protected by said crosslinked polymer image with an etching solution, and removing said crosslinked polymer image from said surface using an aqueous solution.

3. A cataphoretic process for forming a negative image on a conductive surface comprising:
   (a) utilizing said conductive surface as the cathode and an inert material as an anode to form a electrolytic cell;
   (b) immersing said cathode and said anode in a photosensitive polymer composition comprising an aqueous solution or emulsion of at least one polymer free of ethylenic unstauration and having positively charged carrier groups, a photoinitiator and a unsaturated crosslinking monomer;
   (c) completing the electrolytic circuit by connecting the anode and cathode to a direct current voltage source;
   (d) applying a potential across the anode, cathode and polymeric solution or emulsion until said current is decreased to less than about 15 percent of the initial current to coat said cathode;
   (e) discontinuing the applied potential and removing said coated cathode from said cell;
   (f) exposing portions of said coated cathode to a source of actinic radiation; and
   (g) developing the unexposed portions of said coated cathode using an aqueous solution of an organic acid to form a negative crosslinked polymer image on said surface, said image being resistant to etchants or plating solutions but capable of being stripped from said cathode surface using an aqueous solution.

4. The process of claim 3 wherein the unexposed portions of said coated cathode are developed using an aqueous solution of an organic acid selected from the group consisting of acetic, lactic, glycolic, formic and succinic acid.

* * * * *